United States Patent
Sung

[11] Patent Number: 6,136,647
[45] Date of Patent: Oct. 24, 2000

[54] METHOD OF FORMING INTERPOLY DIELECTRIC AND GATE OXIDE IN A MEMORY CELL

[76] Inventor: Kuo-Tung Sung, 6F, #11, Lane 204, Sung-Shan Rd., Taipei, Taiwan

[21] Appl. No.: 08/856,057

[22] Filed: May 14, 1997

[30] Foreign Application Priority Data

Dec. 17, 1996 [TW] Taiwan ................................ 85115557

[51] Int. Cl.[7] .................................................. H01L 21/336
[52] U.S. Cl. ........................... 438/257; 438/261; 438/593
[58] Field of Search .................................... 438/201, 211, 438/257, 261, 593

*Primary Examiner*—John F. Niebling
*Assistant Examiner*—Christopher Lattin

[57] ABSTRACT

A method of fabricating an interpoly dielectric layer and a gate oxide layer of a programmable memory device. This method allows a gate oxide layer and a top oxide layer of the interpoly dielectric layer to be formed simultaneously by two consecutive processes, and essentially comprises the following steps: (1) forming a bottom oxide and a nitride layer of the interpoly dielectric layer on a floating gate of the memory device; (2) defining a gate oxide growing region on the interpoly dielectric layer with a photoresist mask; (3) etching the nitride and bottom oxide layer over the area defined as the gate oxide growth region; (4) forming a first oxide layer on the gate oxide growth region and the nitride of the interpoly dielectric layer above the floating gate; and (5) forming a second oxide layer on the first oxide layer to serve simultaneously as part of the top oxide layer of the interpoly dielectric layer and as part of the gate oxide layer.

11 Claims, 6 Drawing Sheets

METHOD OF FORMING INTERPOLY DIELECTRIC AND GATE OXIDE IN A MEMORY CELL

BACKGROUND OF THE INVENTION

1. Field of the Invention

This invention relates to the $E^2$PROMs and flash EPROMs memory technologies in general, and more particularly to the fabrication of the top oxide of an interpoly dielectric layer and the thickness control of a gate oxide layer to improve the quality of the gate oxide of an $E^2$PROM or flash EPROM memory.

2. Description of the Prior Art

Read only memory (ROM) is a memory device that contains fixed data patterns determined at the time of fabrication. In the fabrication of a ROM, it is necessary to make a storage cell that maintains data after the applied power is turned off. Because data to be stored in a ROM is pre-determined prior to fabrication, the change of a single bit in the stored data would require an alteration of the entire circuit and the manufacturing process.

To avoid having to custom design each ROM from scratch (which would be an extremely costly process), ROMs are often manufactured using a process known as mask programming, by which data is stored in the ROM at one of the final process steps. A ROM made this way is called a mask ROM because the programming in the device is carried out by means of the mask at one of the final process steps. In a typical process for manufacturing a ROM, the final process steps usually involve coating and patterning of an aluminum layer to make interconnects. By changing the mask for the interconnection step, case-specific data may be stored accordingly. The economic advantage of a mask ROM is obvious: All ROMs may be fabricated similarly; customization takes place only during one of the final process steps.

Although mask ROM is a significant improvement over conventional ROMs, data must still be stored in the device during fabrication. In this regard, programmable read-only memory (PROM) is a further improvement to the mask ROM. Data can be electrically programmed in a PROM device by the user. However, a PROM cell can be programmed only once. For example, a typical arrangement employed in a bipolar-junction transistor (BJT) PROM involves the use of polysilicon fuses to connect the emitter to the corresponding digit line. Depending on the desired content of a ROM cell, the fuses may be either left intact or blown up using a large current. This programming step is obviously irreversible.

A still further improvement to mask ROM and PROM is an EPROM, or erasable programmable ROM. A typical EPROM is shown in FIG. 1A, where a floating gate 12 is located between a control gate 14 and a substrate 10. An isolation region 16 surrounds both the floating gate 12 and the control gate 14. Note that an EPROM cell is structurally similar to an NMOS device, except that the former has two gate electrodes and no LDD (lightly doped drain) region.

The contacts of the source 13 and the substrate 10 of an EPROM are both coupled to ground, whereas the control gate 14 and the contact of the drain 15 are connected to high potentials $V_G$ and $V_D$, respectively. The control gate 14 is reverse-biased with respect to the drain 15. Because the drain 15 is not protected by an LDD structure, the PN junction of an n-doped drain 15 and a p-doped substrate 10 will foster the well-known carrier multiplication effect. Some of the hot electrons produced as a result of this effect will be collected by the drain 15, while the rest of them will transverse through the isolation region 16 and be trapped in the floating gate 12. The voltage supplied to the control gate 14 and the drain 15 are switched off as soon as these hot electrons are trapped in the floating gate 12. The electrons trapped in the floating gate do not have enough energy to escape because of the potential barrier in the isolation region 16 surrounding the floating gate 12. As a consequence, the data may be stored in the floating gate 12 for years.

The electric charges in the floating gate 12 determine the value stored in the memory cell. If no electric charge is stored at the floating gate 12, the floating gate 12 will have no influence on the electrical field that control gate 14 generates in the channel region between the source 13 and drain 15. However, if the floating gate 12 is charged with electrons, the electric charges in the floating gate 12 will shield the field of the control gate 14 and generate an electrical field in the channel region; this second electrical field is opposite in sign to the field of the active control gate 14. Thus, a small active signal at the control gate 14 cannot generate a sufficiently strong field to turn on the transistor. Only with a much higher control gate potential can the storage transistor be turned on; i.e., the field of the control gate 14 must be strong enough to compensate the field of the floating gate 12 and to make the channel between source 13 and drain 15 conductive.

Referring again to FIG. 1A, an EPROM can be programmed by loading the floating gate 12 with electrons. The stored data may be erased by exposure to ultraviolet (UV) radiation for a certain period of time. Essentially, the electrons trapped in the floating gate 12 absorb sufficient energy from the UV light and escape from the floating gate 12 in the same way as they were previously trapped. An EPROM with an empty floating gate 12 may be reprogrammed again in accordance with the aforesaid programming process.

Because the electric charges in the EPROM can only be erased with ultraviolet radiation, it is necessary for the packaging of an EPROM to have a window made of, e.g., quartz glass, to allow the die to be exposed to ultraviolet radiation. This results in an increase in the manufacturing cost. Furthermore, all the electric charges (and hence any data or program) in the device are erased all at once, dictating a time-consuming reprogramming process. These concerns can be overcome by using an electrically erasable programmable read-only memory (EEPROM or $E^2$PROM), where the electric charges in the floating gate 12 can be electrically erased. As shown in FIG. 1B, $E^2$PROM is programmed in the same way as the EPROM, i.e., through hot electron ejection generated by a relatively long voltage pulse between the control gate 14 and the drain 15. In this process, electrons generated in the drain 15 traverse through an oxide layer 18 into the floating gate 12. This is the well-known Fowler-Nordheim tunneling mechanism, and the oxide layer 18 is known as tunneling oxide layer.

To erase an $E^2$PROM, an inverse voltage is applied between the control gate 14 and the drain 15. As a result, electrons in the floating gate 12 travel to the drain 15 again through the tunneling oxide layer 18. The stored data is erased accordingly; new data can be programmed into the memory cell again. It is important that the discharge process does not last too long, otherwise too many electrons would be drawn out of the floating gate 12, resulting in a positively charged floating gate. Because the inverse voltage is applied to each pair of the control gate 14 and the drain 15, each gate can be erased independent of other gates. This allows bit-by-bit erasure and reprogramming of the $E^2$PROM cell, a significant improvement over the aforementioned EPROM cell.

A new type of memory cell is the flash EPROM cell, which is widely used in portable computers in the form of a PCMCIA card. The flash memory PCMCIA card may be used as a substitute for floppy disk or hard disk drives. This is because flash memory may be programmed as flexibly as a random access memory (RAM). The structure of flash memory cells is similar to that of E$^2$PROMs, except that the tunneling oxide layer 18 is thinner than that in an E$^2$PROM memory cell, allowing lower programming and erasure voltages applied between the control gate 14 and the drain 15; see FIG. 1A. Although a flash EPROM does not permit bit-by-bit erasure, it can be electrically programmed and erased in a block-by-block manner.

As described above, data storage in an EPROM, E$^2$PROM or flash E$^2$PROM is accomplished by trapping hot electrons or Fowler-Nordheim tunneling electrons in a floating gate. Therefore, it is vitally important to control the thickness of the gate oxide layer or the tunneling oxide layer between the floating gate and the semiconductor substrate.

Typical conventional methods for controlling the thickness of the gate oxide or tunneling oxide layer are depicted as follows. As shown in FIG. 2A, after a floating gate 12 is fabricated, an interpoly dielectric layer is formed on the floating gate 12. This interpoly dielectric layer is a composite of oxide-nitride-oxide (ONO) dielectric materials, including a bottom silicon oxide layer 22, a silicon nitride layer 24, and a top silicon oxide layer 26; all three layers are deposited typically via a chemical vapor deposition (CVD) process. The conventional bottom oxide layer 22 is usually grown to a thickness between 20 to 40 nm; the nitride layer 24 may be anywhere between 10 to 25 nm; and the top oxide layer 26 is usually limited to approximately 3 to 4 nm.

Because a gate oxide layer must be grown in the peripheral area after forming the oxide-nitride-oxide composite structure, the interpoly dielectric layer in the peripheral area must be removed before the oxidizing process. Since it is difficult to grow a gate oxide layer on the silicon nitride layer 24, the conventional process dictates that certain portions of the silicon nitride layer 24 of the ONO interpoly dielectric in the peripheral area be completely removed before growing the gate oxide. Two conventional methods may be used to accomplish this goal.

The first prior art method for removing selected portions of the ONO dielectric is shown in FIG. 2B, where the top oxide layer 26 and the silicon nitride layer 24 over a gate oxide growth region 28 are removed via a dry etch process using CF$_4$ as the etchant. Because the etch rate in the bottom oxide is relatively low, the dry etch process stops within the bottom oxide layer 22. Next, a gate oxide layer 30 is formed on the bottom oxide layer 22 through a thermal oxidation process; see FIG. 2C. The thickness of the remaining bottom oxide layer 22 is an important factor in this method. If the thickness of the remaining bottom oxide layer 22 cannot be ascertained, it will be difficult to control the thickness of the gate oxide layer that is subsequently grown. On the other hand, it is not advisable to etch away all of the remaining bottom oxide 22 with hydrofluoric acid, because the photoresist film 32 (shown in FIG. 2B) cannot be used as a shield to the hydrofluoric acid; the ONO structure on top of the floating gate 21 will also be etched. Using the buffered oxide etch (BOE) process does not solve this problem, either, because the field oxide region 34 will be etched at a greater etch rate, causing deterioration of the isolation region between the gates.

The second prior art method for removing selected portions of the ONO dielectric is depicted in FIG. 2D, in which a dry etch process (using CF$_4$ as the etchant) is used to remove the entire ONO structure from the gate oxide growth region 28. This etch process stops at the substrate 10. Next, as is illustrated in FIG. 2E, a gate oxide layer 36 is formed on the gate oxide growing region 28 via a thermal oxidation process. This method requires that the dry etchants be able to etch silicon dioxide but not silicon; otherwise, the silicon substrate would also be etched, resulting in adverse effects such as gate oxide quality degradation.

SUMMARY OF THE INVENTION

Oxide-Nitride-Oxide (ONO) is normally used as the interpoly dielectric layer in EPROMs, E$^2$PROMs, or flash E$^2$PROMs. Part of such a composite dielectric layer must be removed before growing the gate oxide. In the present invention, an oxide-nitride (ON) composite layer was formed in lieu of the conventional ONO dielectric layer. The portion of the ON layer over the gate oxide growth region is then removed. The removal of such an ON film causes much less damage to the substrate compared to the conventional case of the ONO film. After the removal process, a thermal oxidation process and an oxide CVD process are used to grow the gate oxide and the top oxide of the ONO layer simultaneously. This novel process provides better assurance of the quality of the gate oxide and the ONO interpoly dielectric layers.

It is therefore an object of the present invention to provide a new method of fabricating a memory device that can effectively control the thickness of the gate oxide of the memory cell.

It is another object of the present invention to provide a new method of fabricating an interpoly dielectric layer of a memory device that reduces etching of the Si substrate during the conventional fabricating process.

It is a further object of the present invention to improve the quality of the gate oxide by simultaneously forming such gate oxide and a top oxide of the interpoly layer via thermal oxidation and CVD processes.

The present invention provides a method to improve the fabrication process of interpoly and gate oxide layers of a memory cell based on the objects stated above. A specific embodiment of the present invention comprises the following steps:

An interpoly dielectric layer of a composite of silicon oxide and silicon nitride is formed on a floating gate. A gate oxide growth region on the substrate is defined by using a photoresist mask; the exposed nitride layer of the interpoly layer as defined by the photoresist mask is etched by a highly selective etching process. A bottom oxide layer of the interpoly dielectric layer on the gate oxide growth region is preferably etched by dipping the structure in HF acid or BOE. Next, a first gate oxide is formed on the substrate via a thermal oxidation process. Meanwhile, a thin layer of silicon dioxide is formed on the silicon nitride layer of the interpoly dielectric layer above the floating gate. A silicon dioxide layer is deposited on the interpoly dielectric layer and the gate oxide layer via a CVD process; this silicon dioxide layer serves both as a top oxide layer of the interpoly dielectric layer and as a second gate oxide layer. The structure is then annealed to form a memory cell having a high quality gate oxide layer.

In another specific embodiment of the present invention, after the aforementioned bottom oxide layer etch, a first silicon dioxide layer is formed via a CVD process on the interpoly dielectric layer and on the substrate. This layer serves as a first top oxide layer and a first gate oxide layer of the interpoly dielectric layer. Subsequently, a second silicon dioxide layer is form on the first silicon dioxide layer via a thermal oxidation process to serve as a second gate oxide layer and a second top oxide layer.

An advantage of the present invention is that it provides an improved EPROM, $E^2$PROM or flash $E^2$PROM in which the gate oxide layer thickness is better controlled.

Another advantage of the present invention is that it provides an improved memory cell in which the gate oxide layer and the top oxide layer in the interpoly dielectric structure can be simultaneously formed.

These and other objects, features and advantages of the present invention will no doubt become apparent to those skilled in the art after reading the following detailed description of the preferred embodiment which is illustrated in the several figures of the drawing.

IN THE DRAWINGS

DETAILED DESCRIPTION OF THE PREFERRED EMBODIMENTS

While the present invention may be embodied in many forms, details of preferred embodiments are schematically shown in FIGS. 3A–3G, with the understanding that the present disclosure is not intended to limit the invention to the embodiments illustrated.

As discussed in the foregoing, control of the thickness of the gate oxide layer is of vital importance to the fabrication of a modern MOS device. The gate oxide layer of a modern MOS device is usually 3 to 30 nm thick. In some multiple layer devices such as a flash memory, the tunneling oxide layer may be thinner than 10 nm, and in some circumstances it may be as thin as 5 nm. It is thus a challenging task to maintain the thickness and quality of these thin oxide layers in the fabrication of MOS devices.

Figure 1A:
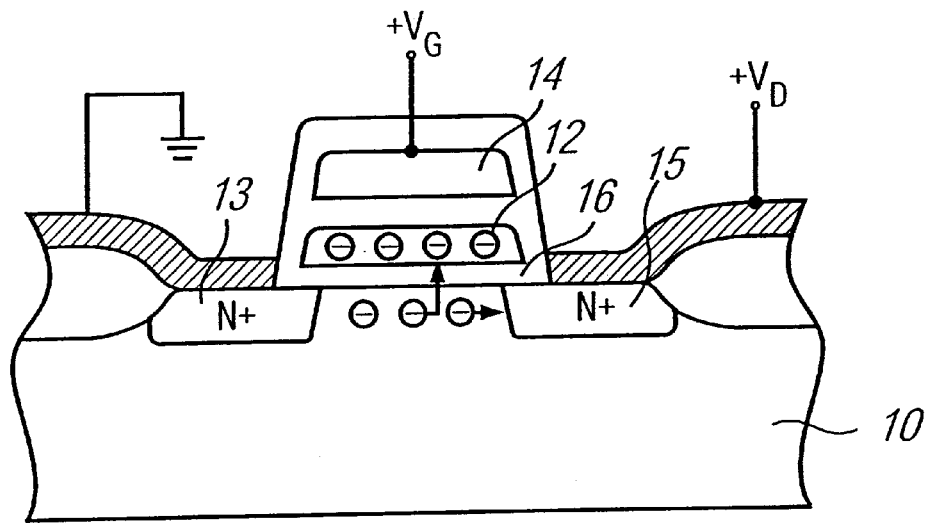
FIG. 1A is a cross-sectional view of a prior-art EPROM memory cell.
Figure 1B:
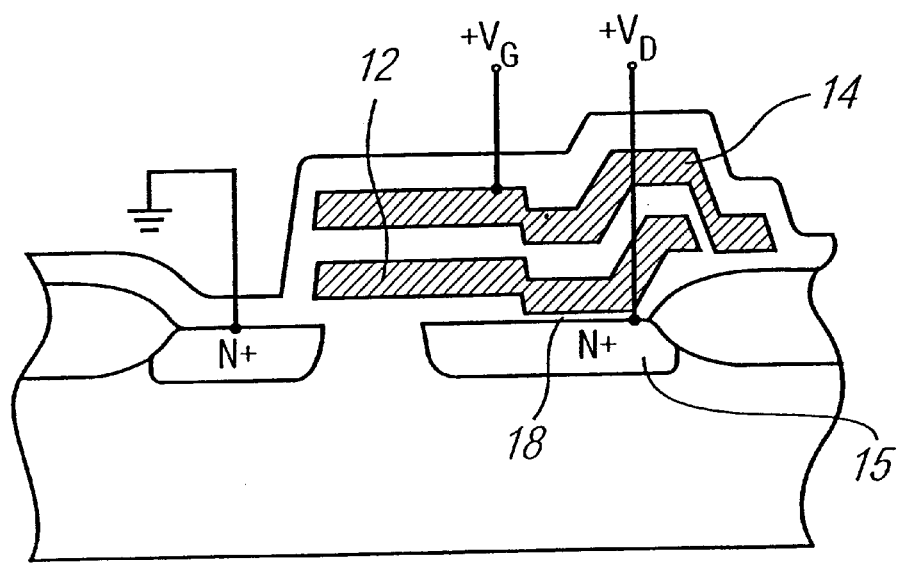
FIG. 1B is a cross-sectional view of a prior-art $E^2$PROM memory cell.
Figure 2A:
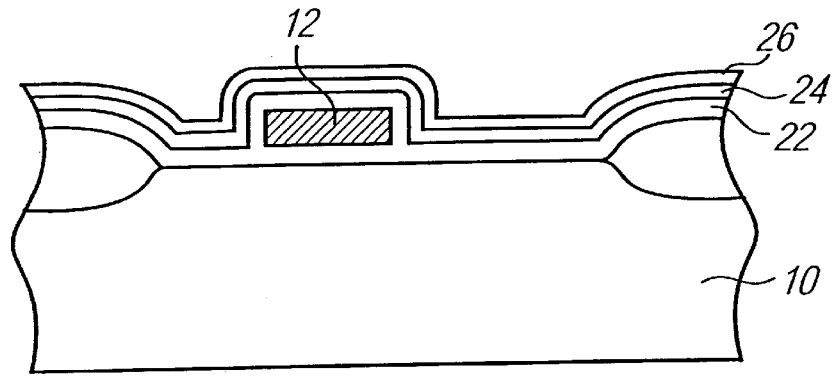
FIG. 2A is a cross-sectional illustration of a prior-art processing step for forming an ONO interpoly dielectric layer on a floating gate.
Figure 2B:
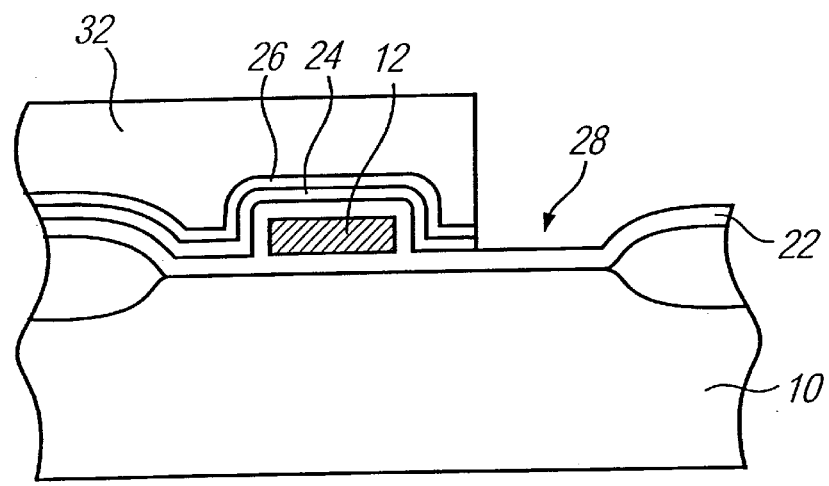
FIG. 2B is a cross-sectional illustration of a prior-art processing step for etching the silicon nitride layer of the ONO structure over the gate oxide growth region.
Figure 2C:
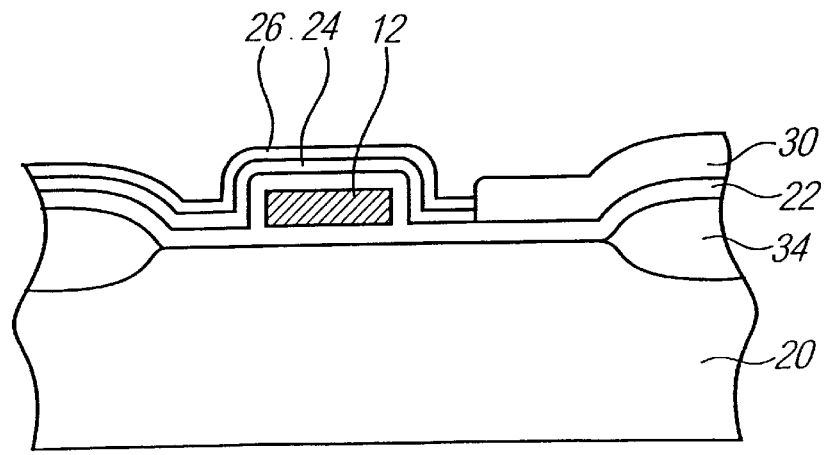
FIG. 2C is a cross-sectional illustration of a prior-art processing step for forming a gate oxide layer over the gate oxide growth region.
Figure 2D:
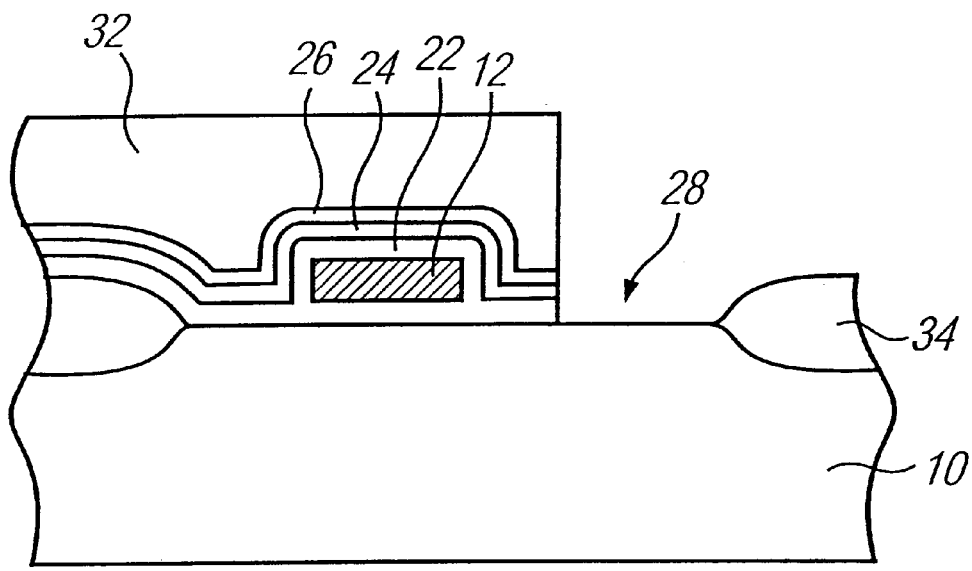
FIG. 2D is a cross-sectional illustration of a prior-art processing step for etching the ONO layer over the gate oxide growth region.
Figure 2E:
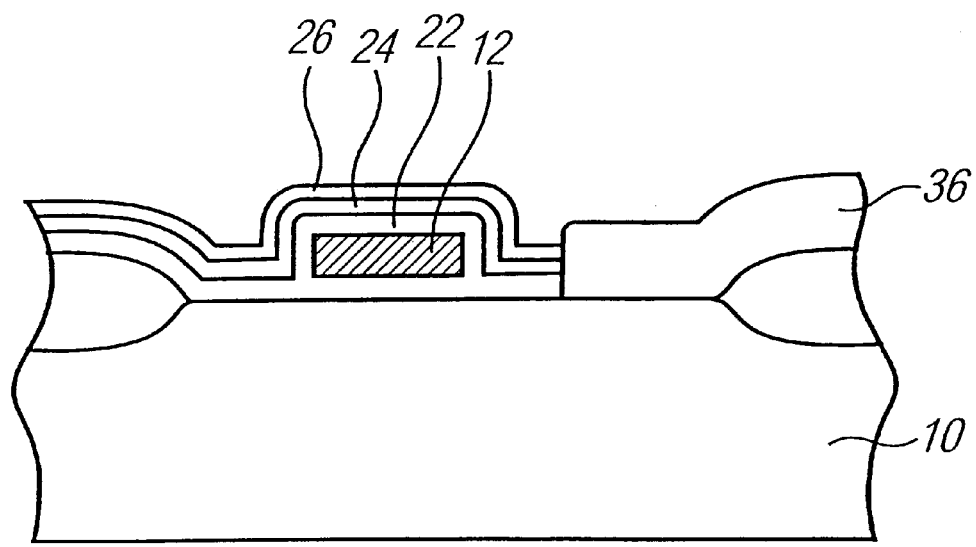
FIG. 2E is a cross-sectional illustration of a prior-art processing step for forming a gate oxide layer on the substrate.
Figure 3A:
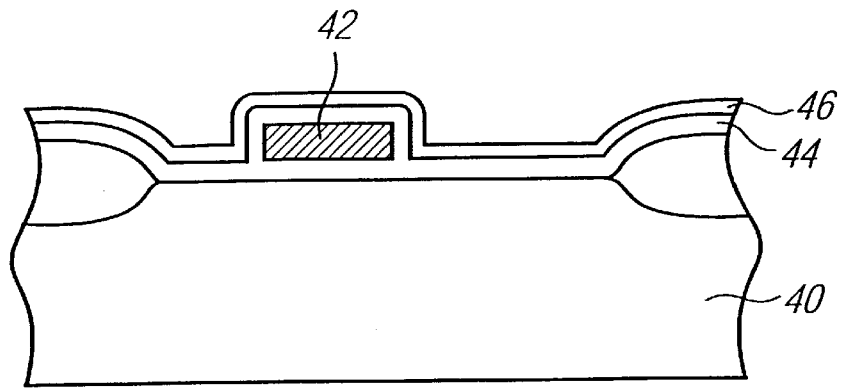
FIG. 3A is a cross-sectional view of a memory cell of the present invention after formation of a composite oxide-nitride interpoly dielectric layer on a floating gate.
Figure 3B:
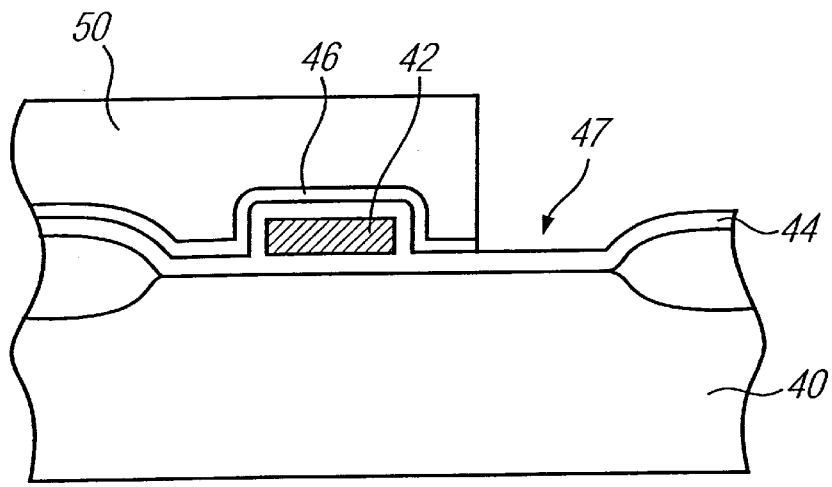
FIG. 3B is a cross-sectional view of a memory cell of the present invention after etching of nitride of the oxide-nitride dielectric layer over the gate oxide growth region.
Figure 3C:
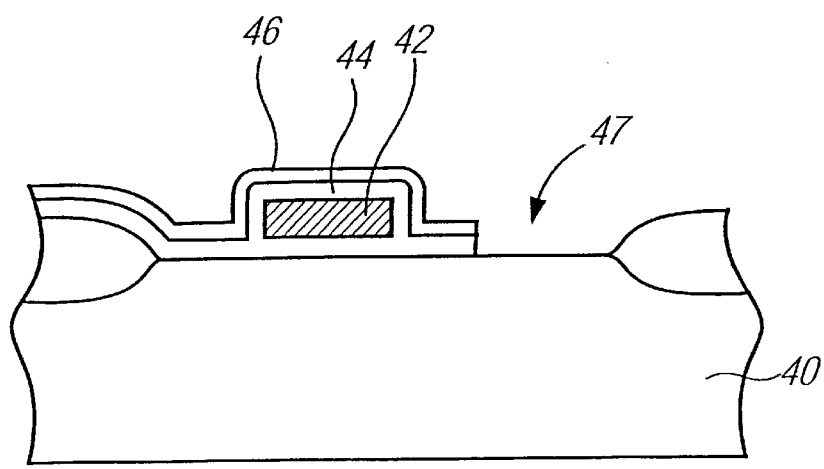
FIG. 3C is a cross-sectional view of a memory cell of the present invention after removal of the bottom oxide of the oxide-nitride dielectric layer by a wet etching process.

In a specific embodiment of the present invention as depicted in FIG. 3A, and as known to those skilled in the art, an interpoly dielectric layer may be formed via a CVD process on a floating gate 42 fabricated on a substrate 40. The interpoly layer is a composite oxide-nitride (ON) dielectric layer having a bottom silicon dioxide layer 44 and a silicon nitride layer 46. Unlike the conventional oxide-nitride-oxide (ONO) structure, this structure does not have a top oxide layer. The bottom oxide layer 44 is approximately 2 to 20 nm thick, while the silicon nitride layer 46 is approximately 2 to 20 nm thick.

Because it is difficult to grow a gate oxide on the nitride layer 46, it is desirable to remove the nitride layer 46 before growing the gate oxide. Before the removal of the nitride layer 46, a gate oxide growth region 47 is defined by coating and patterning a photoresist 50 covering part of the substrate 40; see FIG. 3B. The undesired portion of the top nitride layer 46 is then removed via a dry etching technique. The dry etching process should have a high nitride etch rate and a low oxide etch rate. As a result, the nitride layer will be completely removed before the Si substrate is damaged by the dry etching process. After the nitride layer 46 is removed, the entire structure is dipped in hydrofluoric acid or BOE to remove the portion of the exposed bottom oxide 44 that is not protected by the overlaying nitride layer 46; see FIG. 3C. Following this wet etch step, one of the two methods described below may be used to grow the gate oxide layer and the top oxide layer of the interpoly dielectric layer.

Figure 3D:
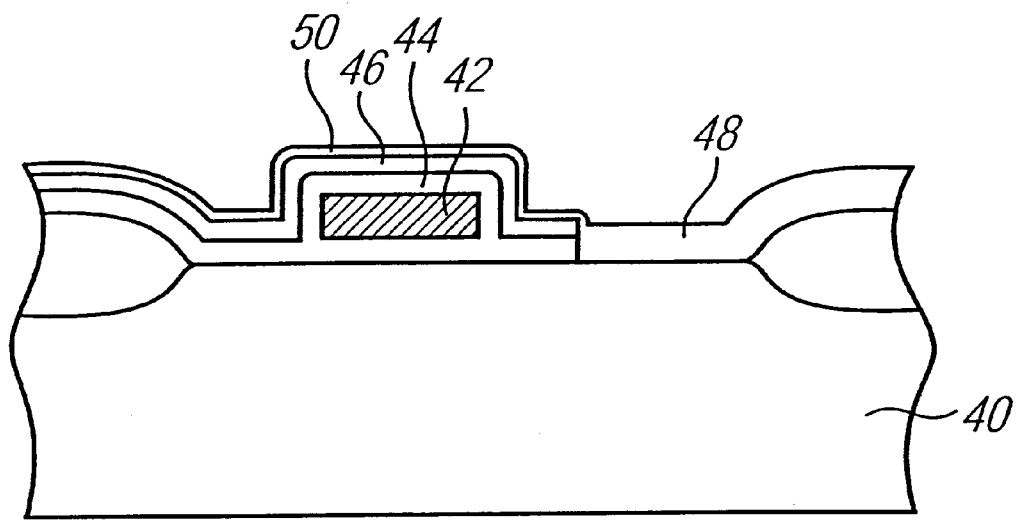
FIG. 3D is a cross-sectional view of a memory cell of one embodiment of the present invention after formation of a first gate oxide layer.
Figure 3E:
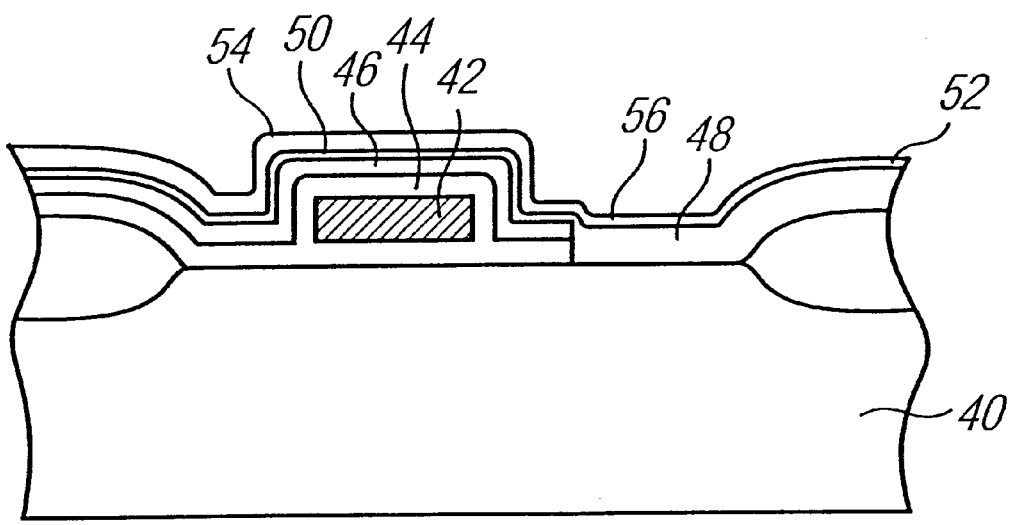
FIG. 3E is a cross-sectional view of a memory cell of the embodiment shown in FIG. 3D after simultaneous formation of a second gate oxide layer and a top oxide on the oxide-nitride dielectric layer.

In the first embodiment of the present invention, as illustrated in FIG. 3D, a first gate oxide layer 48 of approximately 2 to 20 nm is formed on the substrate 40, preferably via a thermal oxidation process. A very thin layer of silicon dioxide 50, presumably comprising only a few atomic layers, is also formed on the nitride layer 46 of the oxide-nitride interpoly dielectric compound during this thermal oxidation process. A thermal oxidation process is used because it can provide oxides having the highest quality but the lowest interface trap densities. Next, as is shown in FIG. 3E, a silicon dioxide layer 52 is deposited via a CVD process over the thin silicon dioxide layer 50 and the first gate oxide layer 48. One of the reasons for using the CVD process is because, albeit a slow process, it provides an oxide film with excellent uniformity. This characteristic ensure a uniform oxide layer 52 over the entire structure. The silicon dioxide layer 52 in effect serves as a top oxide layer 54 of the oxide-nitride dielectric structure and a second gate oxide layer 56. This silicon dioxide layer 52 is approximately 2 to 20 nm thick. The entire substrate 40 is then annealed at 850°–950° C. to generate high quality gate oxide layers with improved mobility, high dielectric constant, low gate oxide dopants, and a higher breakdown voltage.

Figure 3F:
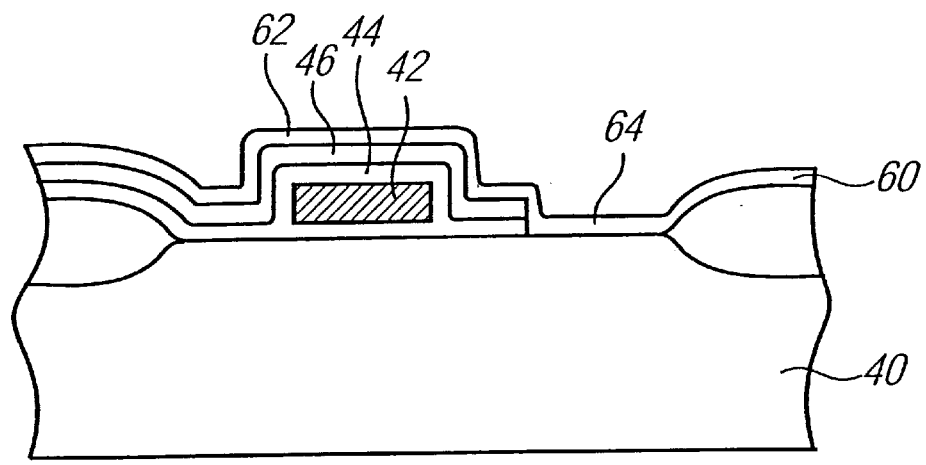
FIG. 3F is a cross-sectional view of a memory cell of another embodiment of the present invention after formation of a first top oxide of the interpoly dielectric layer and a first gate oxide layer.
Figure 3G:
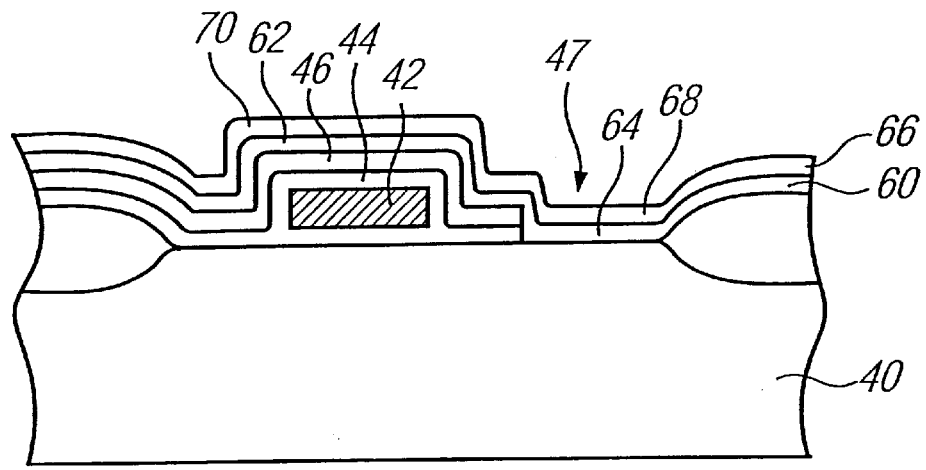
FIG. 3G is a cross-sectional view of a memory cell of the embodiment shown in FIG. 3F after formation of a second gate oxide layer and a second top oxide of the interpoly dielectric layer.

The second embodiment of the present invention is illustrated in FIGS. 3F and 3G. As shown in FIG. 3F, a first silicon dioxide layer 60 is deposited on the nitride layer 46 of the oxide-nitride structure and on the substrate 40, preferably via a CVD process. This first silicon dioxide layer 60 serves as a first top oxide layer 62 of the oxide-nitride structure and a first gate oxide layer 64, and is approximately 2 to 20 nm thick. Next, as is depicted in FIG. 3G, a second silicon dioxide layer 66 is formed, preferably via a thermal oxidation process, on the first silicon dioxide layer 60. This second oxide layer serves as a second gate oxide layer 68 and a second top oxide layer 70, and is approximately 2 to 20 nm thick.

Referring again to FIG. 3C. In the present invention, the nitride layer 46 of the oxide-nitride structure is insoluble in the HF or BOE etching process. Hence, in the process of etching the bottom oxide layer 44 over the gate oxide growth region 47, the nitride layer 46 on the bottom oxide layer 44 over the floating gate 42 can prevent the oxide-nitride structure and the floating gate 42 from being damaged, in spite of the fact that the photoresist layer, which is present on the silicon nitride layer 46 during the etching process, may not be totally immune to being etched in the HF or BOE etching process. Moreover, in the present invention, the bottom oxide layer 44 at the gate oxide growth region 47 is removed before growing the gate oxide 48 (as shown in FIGS. 3D and 3E); the thickness of the gate oxide layer 48 is thus more controllable than what is available in the prior art. See FIG. 3D. Thus, the current process alleviates the difficulties in controlling the thickness of the gate oxide layer in conventional processes. As a consequence, the quality of the gate oxide is greatly improved. Furthermore, according to the present invention, an oxide-nitride structure is formed on the floating gate 42. A top oxide layer 54 is subsequently formed on the oxide-nitride structure by the CVD process. This approach is thus a substantial improvement over conventional processes, in which the top oxide of the oxide-nitride-oxide structure may also be adversely affected during the etching process. The present invention, therefore, provides a more effective control over thickness of the interpoly dielectric layer (i.e., the oxide-nitride-oxide structure).

While the invention has been particularly shown and described with reference to the preferred embodiments, it will be understood by those skilled in the art that many other modifications and variations may be made thereto without departing from the broader spirit and scope of the invention as set forth in the claims. The specification and drawings are accordingly to be regarded as an illustrative, rather than in a restrictive meaning.

What is claimed is:

1. A method of fabricating an interpoly dielectric layer and a gate oxide layer of a programmable memory device having a substrate and a floating gate, comprising the steps of:
    forming an interpoly dielectric layer on the floating gate, wherein said dielectric layer includes a bottom oxide layer and a silicon nitride layer;
    lithographically defining a gate oxide growth region to expose portions of said nitride layer;
    etching said exposed portions of said nitride layer;
    etching said bottom oxide layer at said gate oxide growth region;
    simultaneously forming a first gate oxide layer on said substrate and a top oxide layer on said interpoly dielectric layer; and
    simultaneously forming a silicon dioxide layer on said first gate oxide layer and on said top oxide layer.

2. The method of claim 1, wherein the formation of said first gate oxide layer and said top oxide layer is by thermal oxidation and the formation of said silicon dioxide layer is by chemical vapor deposition.

3. The method of claim 1, wherein the formation of said first gate oxide layer and said top oxide layer is by chemical vapor deposition and the formation of said silicon dioxide layer is by thermal oxidation.

4. The method of claim 2, after depositing said silicon dioxide layer, further comprising the step of annealing the substrate.

5. The method of claim 3, after depositing said silicon dioxide layer, further comprising the step of annealing the substrate.

6. The method of claim 1, wherein said bottom oxide layer of said interpoly dielectric layer is approximately 2 to 20 nm thick.

7. The method of claim 1, wherein said silicon nitride layer of said interpoly dielectric layer is approximately 2 to 20 nm thick.

8. The method of claim 1, wherein said oxide etching process includes dipping in hydrofluoric acid.

9. The method of claim 1, wherein said oxide etching process includes etching with a buffered oxide etchant.

10. The method of claim 1, wherein said first gate oxide layer is approximately 2 to 30 nm thick.

11. The method of claim 1, wherein said first gate oxide layer is approximately 2 to 30 nm thick.

* * * * *

UNITED STATES PATENT AND TRADEMARK OFFICE
CERTIFICATE OF CORRECTION

PATENT NO. : 6,136,647
DATED : October 24, 2000
INVENTOR(S) : Kuo-Tung Sung

It is certified that error appears in the above-identified patent and that said Letters Patent is hereby corrected as shown below:

ON THE TITLE PAGE
Item [73] Assignee: Mosel Vitelic, Inc., Hsinchu, Taiwan, R.O.C.

Signed and Sealed this

Twenty-ninth Day of May, 2001

Attest:

NICHOLAS P. GODICI

*Attesting Officer*  *Acting Director of the United States Patent and Trademark Office*